(12) United States Patent
Anthony

(10) Patent No.: US 7,015,854 B2
(45) Date of Patent: Mar. 21, 2006

(54) CHARGE-DOMAIN A/D CONVERTER EMPLOYING MULTIPLE PIPELINES FOR IMPROVED PRECISION

(75) Inventor: Michael P. Anthony, Andover, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/889,281

(22) Filed: Jul. 12, 2004

(65) Prior Publication Data

US 2006/0007031 A1    Jan. 12, 2006

(51) Int. Cl.
*H03M 1/12* (2006.01)

(52) U.S. Cl. ........................................ 341/172; 341/162

(58) Field of Classification Search ................ 341/161, 341/162, 172
See application file for complete search history.

(56) References Cited

U.S. PATENT DOCUMENTS

| | | | |
|---|---|---|---|
| 3,969,634 A | 7/1976 | Su et al. | |
| 4,035,667 A | 7/1977 | Heller | |
| 4,104,543 A | 8/1978 | Maeding | |
| 4,210,825 A | 7/1980 | Crochiere et al. | |
| 4,239,983 A | 12/1980 | Edwards et al. | |
| 4,246,496 A | 1/1981 | Heller | |
| 4,489,309 A | 12/1984 | Schlig | |
| 4,573,177 A | 2/1986 | Petrosky | |
| 4,639,678 A | 1/1987 | Schlig et al. | |
| 4,649,554 A | 3/1987 | Boudewijns et al. | |
| 4,686,648 A | 8/1987 | Fossum | |
| 5,579,007 A | 11/1996 | Paul | |
| 5,736,757 A | 4/1998 | Paul | |
| 6,222,478 B1 * | 4/2001 | Bright | 341/162 |
| 6,340,943 B1 * | 1/2002 | Chow et al. | 341/161 |

OTHER PUBLICATIONS

Fossum, Eric R., et al., "A Linear and Compact Charge-Coupled Charge Packet DifferencerReplicator", IEEE Transactions on Electron Devices, Dec. 1984, vol. ED-31, No. 12, 6 pages.
Fossum, Eric R., "Wire Transfer of Charge Packets for On-Chip CCD Signal Processing", SPIE, vol. 1242, Jul. 1990, pp. 179-186.
Colbeth, Richard E., et al., "A 1-GHz Charge-Packet Relicator/Subtractor Circuit for GaAs CCD Signal Processing", IEEE Journal of Solid-State Circuits, vol. 25, No. 4, Aug. 1990, pp. 1016-1019.
Fossum, Eric R., "Wire Transfer of Charge Packets Using a CCD-BBD Structure for Charge-Domain Signal Processing", IEEE Transactions on Electron Devices, vol. 38, No. 2, Feb. 1991, pp. 291-298.
Paul, Susanne A., et al., "A Nyquist-Rate Pipelined Oversampling A/D Converter", IEEE Journal of Solid State Circuits, vol. 34, No. 12, Dec. 1999, pp. 1777-1787.
Sheppard, Scott T., "Charge Coupled Devices", website http://www.ecn.purdue.edu/WBG/Device_Research/CDDa/index.html, Oct. 26, 2001.

* cited by examiner

*Primary Examiner*—Howard Williams
(74) *Attorney, Agent, or Firm*—Daly, Crowley, Mofford & Durkee, LLP

(57) ABSTRACT

A new architecture is provided in which a master A/D converter of limited precision controls the adjustment-charge steering of a set of similar slave A/D converter pipelines. This architecture relieves the layout constraints imposed by prior architectures and also reduces power consumption of the device. By spatially interleaving the slave pipelines in an array, the new architecture also improves accuracy.

16 Claims, 4 Drawing Sheets

CHARGE-DOMAIN A/D CONVERTER EMPLOYING MULTIPLE PIPELINES FOR IMPROVED PRECISION

STATEMENTS REGARDING FEDERALLY SPONSORED RESEARCH

This invention was made with government support under Contract No. F19628-00-C-0002 awarded by the Air Force. The government has certain rights in the invention.

CROSS REFERENCE TO RELATED APPLICATIONS

Not Applicable.

FIELD OF THE INVENTION

The present invention relates generally to analog-to-digital converters, and more specifically to analog-to-digital converters employing multiple pipelines for providing improved accuracy.

BACKGROUND OF THE INVENTION

As is known in the art, analog-to-digital converters (ADCs) convert a signal in analog format to a signal in digital format. Conventional ADC circuits can have a variety of circuit architectures, each of which has certain concomitant advantages and disadvantages. Known ADC architectures include pipeline, sub-ranging, sigma-delta, cyclic, flash, successive approximation, and dual-slope. Each architecture is generally applicable to a limited operating range. That is, each of these architectures has strengths and weaknesses that make them more amenable to working in certain ranges of frequency and resolution.

Pipelined ADCs use the successive-approximation algorithm, but perform the required comparisons sequentially in successive stages rather than in a single stage as in the classic successive-approximation architecture. The pipelined architecture trades off circuit complexity in favor of increased sample rate; an N-bit pipelined ADC is approximately N times as fast as an N-bit successive-approximation ADC, while demanding at least N times as much circuit complexity. This tradeoff is advantageous for applications requiring relatively high resolution (N≧8) combined with relatively high sample rate. ADCs employing the pipelined architecture can be implemented using several basic circuit technologies including charge-domain (CCD) technology.

Prior-art charge-domain pipelined ADCs have been limited in precision to approximately ten bits. One reason for this limit is the difficulty of precisely comparing charges. A second limit on increasing precision arises from two considerations. One consideration is that the quantity of charge used to represent the signal in a charge-domain ADC must be increased in proportion to the square of the desired signal-to-noise ratio, as shown by the following equation:

$$Q_{SIG} \propto 2^{2N} \qquad \text{(Equation 1)}$$

where N is the number of bits of resolution of the ADC.

A second consideration is that the gate capacitance of the CCDs employed in the ADC must be increased proportionately to accommodate the signal charge. For a given fabrication process, increasing the gate capacitance requires an increase in gate length (L), gate width (W), or both. Increasing L reduces the CCD charge-transfer speed, thus limiting the maximum sample rate of the ADC. This tradeoff is unacceptable in many cases, so W must be increased.

The extent to which W can be increased, however, is limited by dynamic effects. The gate clock voltages and signal charge must propagate along the width of the CCD gates. Thus, increasing W slows these signals and again limits the sample rate of the device. For this reason, the potential for increasing W is limited for any particular sample rate.

Because charge transfer in CCDs occurs only between contiguous gates, the required charge-domain ADC operations of conditional charge transfer (also referred to as charge steering) and charge merging involve changes in the direction of charge flow. As gate area is increased to accommodate larger signal charge, the CCD structures for these functions must increase in both L and W. As before, these increases in L and W reduce charge-transfer speed, and thus are limited for any particular sample rate.

SUMMARY OF THE INVENTION

A method and apparatus for providing a new architecture for a high performance, high-resolution charge-domain ADC is presented. The ADC includes a master A/D converter of limited precision which controls the adjustment-charge steering of a set of slave charge-domain A/D converter pipelines. This architecture relieves the layout constraints imposed by prior architectures and also reduces power consumption of the device. By spatially interleaving the slave pipelines in an array, the new architecture also improves accuracy.

BRIEF DESCRIPTION OF THE DRAWINGS

The invention will be more fully understood from the following detailed description taken in conjunction with the accompanying drawings, in which.

DETAILED DESCRIPTION OF THE INVENTION

A new architecture for a high performance, high resolution ADC is presented. The ADC includes a master A/D converter of limited precision which controls the adjustment-charge steering of a set of slave charge-domain A/D converter pipelines. The present invention provides a way to circumvent the layout issues described above, allowing the practical layout of charge-domain ADCs with arbitrarily large precision without compromising sample rate.

In the preferred embodiment of this invention, a sub-ranging pipelined ADC architecture is used. In this architecture, an N-bit ADC is divided into two or more blocks, each block containing a pipelined (sub-)ADC of less than N bit resolution. Between blocks, the common-mode charge component of the charge pair that represents the signal is reduced, while the charge-pair difference is maintained or amplified.

Conventional charge-domain pipelined ADCs include a pair of CCD registers that carry signal charges ("signal channels") and a pair of CCD registers that carry and process reference charges ("scaling channels"). The signal and scaling channels are linked by CCD elements that conditionally transfer ("steer") the reference charges and merge them with the signal charges in the signal channels. The ADC also includes circuitry for introducing reference charge packets to the scaling channels. The ADC also includes circuitry for introducing a differential charge pair, whose difference is proportional to the input signal, to the signal channels. This circuitry may generate the differential charge pair in response to an input voltage signal (either single-ended or differential) and a sampling clock, thus comprising a Sample/Hold circuit. Such a conventional charge-domain pipelined ADC constitutes one part of the present invention, and is described in detail below.

Figure 1:
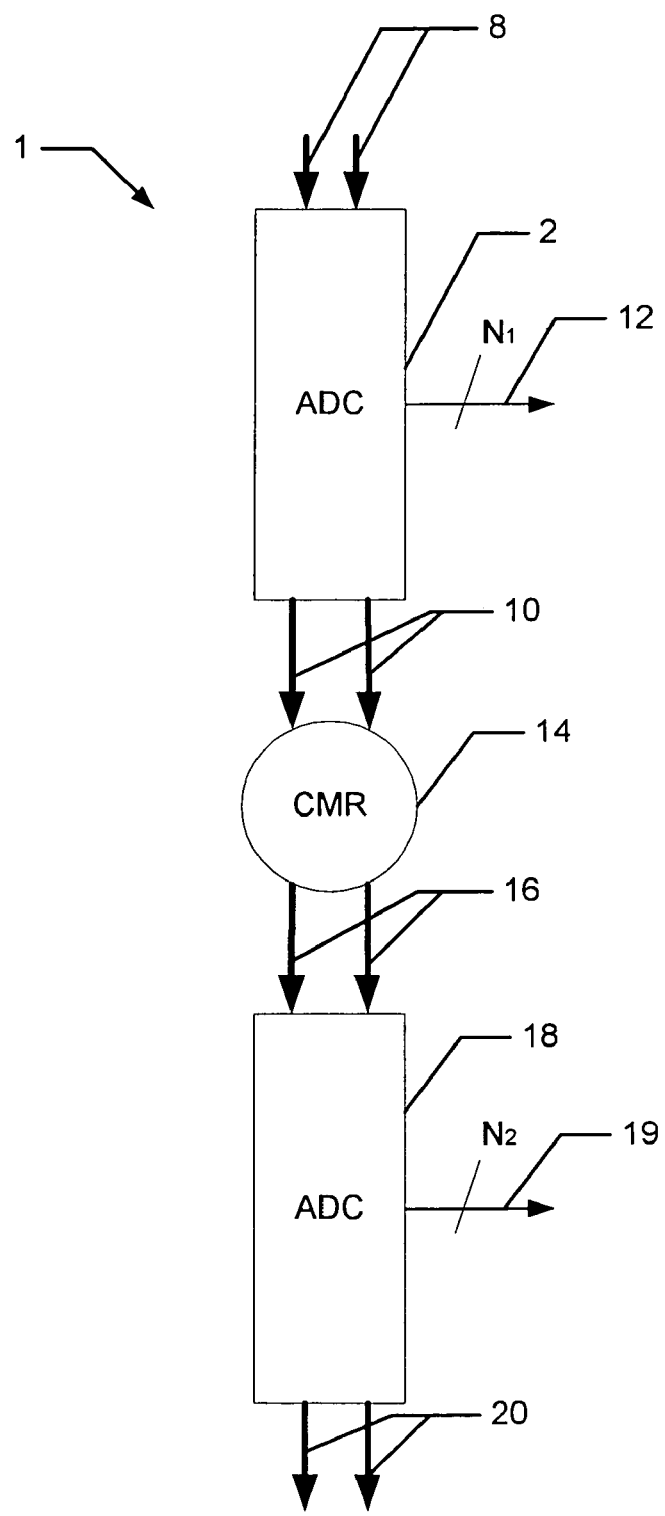
FIG. 1 is a block diagram of a sub-ranging pipelined charge-domain ADC.

In FIGS. 1 through 4, the movement of charge packets is shown in heavy lines; ordinary voltage or current signals are shown in light lines. Referring now to FIG. 1, a sub-ranging pipelined charge-domain ADC 1 is shown. The sub-ranging pipelined charge-domain ADC comprises a charge-domain pipelined ADC 2 described in detail below, a common-mode-reduction circuit 14, and a second charge-domain pipelined ADC 18.

The first pipelined ADC 2 contains a number $N_1$ of stages; and is supplied with a differential signal-charge pair 8, which may be generated by a sample/hold circuit or by other means. The pipelined ADC 2 develops an output differential signal charge pair 10 in which the charge difference is reduced from that of the input pair 8. It produces the $N_1$-bit digital output signal 12. This apparatus is referred to as the first "block" of the complete sub-ranging ADC.

This first pipelined ADC 2 is followed by a common-mode reduction (CMR) circuit or device 14 which receives as input the differential-charge pair 10 and reduces its relative common-mode charge while maintaining or amplifying its differential charge, to produce an output differential-charge pair 16.

The output 16 of common-mode-reduction circuit 14 is supplied as an input to a second charge-domain pipelined ADC 18, containing a number $N_2$ of stages, which constitutes a second block of the sub-ranging ADC 1. This second block develops as its output the differential charge pair 20. The second block does not require a Sample/Hold circuit, since it receives its input signal charge directly from the common-mode-reduction circuit. The second ADC block 18 produces the $N_2$-bit digital output signal 19. The blocks shown may be followed by additional common-mode-reduction circuits and additional ADC blocks.

In order to increase resolution, both signal and scaling channels of at least the first block of a sub-ranging pipelined charge-domain ADC must be increased in size as discussed above, and correspondingly larger charges must be introduced.

According to the present invention, the signal and scaling channels of at least the first block of a sub-ranging pipelined charge-domain ADC, together with their steering and merging structures, are each divided into a number K of smaller registers, each with 1/K the gate area required to support the desired total signal charge. The circuitry for introducing reference and signal charges is similarly subdivided into K units, each supplying 1/K the total charge. One set of these smaller CCD registers comprising two signal and two scaling channels plus steering and merging structures, together with reference- and signal-charge introduction apparatus, is here termed an ADC "cell".

Figure 2:
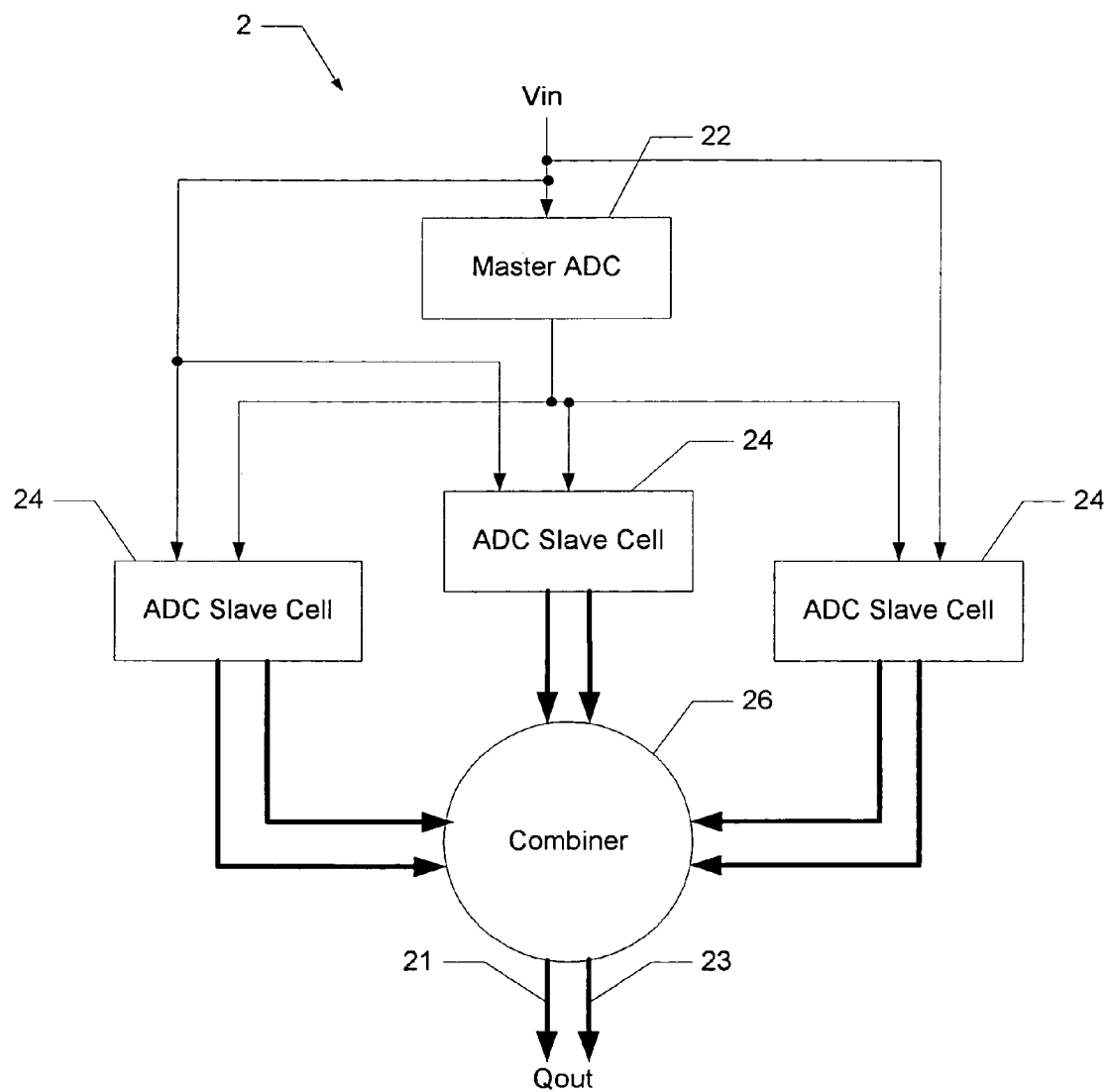
FIG. 2 is a top-level block diagram of the ADC of the present invention.

Referring now to FIG. 2, an ADC block 2 of the overall sub-ranging converter comprises one ADC 22, termed the "master" ADC; K cells 24 as described above, termed "slave" cells; and a combiner 26. FIG. 2 illustrates the case of three slave cells 24 (K=3). The adjustment charges in each slave cell 24 are steered and merged as they would be if the slave cell were itself part of a conventional pipelined charge-domain ADC. In this architecture, however, the decisions as to adjustment-charge disposition are made simultaneously for all the slave cells 24 by the master ADC 22. The slave cells 24 do not contain comparators (which a conventional ADC of this type would require), nor do they have floating gates (conventionally needed for charge-difference sensing).

The differential-charge output pairs of all K slave cells 24 are provided as inputs to combiner 26. The inputs to combiner 26 are combined into a differential-charge output pair 21 and 23 whose difference is the sum of the input charge-pair differences. In a complete sub-ranging pipelined charge-domain ADC constructed according to one version of this invention, the output charge pair 21 and 23 from combiner 26 constitutes the output of one block of the complete ADC (as discussed above in connection with FIG. 1). This output is then supplied as input to a common-mode reduction circuit such as block 14 in FIG. 1.

In another version of this invention, combiner 26 may produce more than one output charge pair. This version is suitable for cases in which not only the first, but also the second (and possibly later) blocks benefit from the multiple-pipeline structure described above. In this version, the inputs to combiner 26 are subdivided into two or more groups; the inputs in each group are combined as described above to produce a separate output charge pair. Each such separate output is then supplied to a separate common-mode reducer and to a separate ADC pipeline in the next block of the overall sub-ranging ADC.

Figure 3:
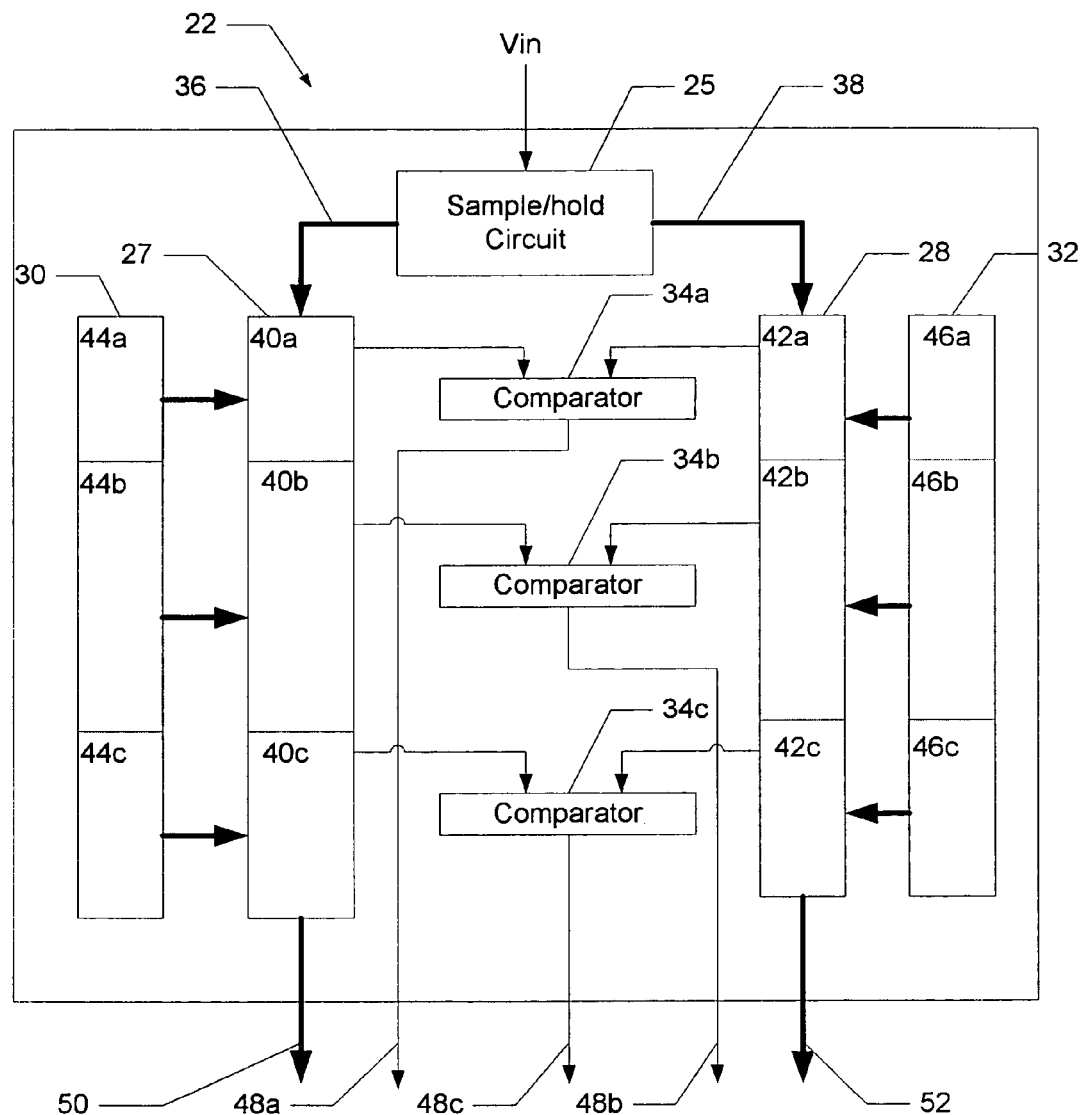
FIG. 3 is a block diagram of a master ADC.

Referring now to FIG. 3 in conjunction with FIG. 2, a master ADC 22 is shown. The master ADC 22 shown in FIG. 3 and described below is of a conventional charge-domain pipelined type; other types of ADC may be used instead for the master ADC of this invention. The master ADC 22 of FIG. 3 comprises a sample/hold circuit 25, two signal channels 27 and 28, two scaling channels 30 and 32 and comparators 34a–34c. The ADC cell incorporated in the master ADC may be one of the total of K cells, or it may be separate; in the described embodiment, it is separate. The master ADC described here includes three stages identified as "a", "b", and "c"; however, it should be appreciated that any number of stages could be used. The number of stages used determines the resolution $N_1$ of the first block of the sub-ranging ADC. This number of stages $N_1$ is unrelated to the multiplicity K of slave cells in the overall A/D converter.

The master ADC 10 operates as follows. An input signal $V_{in}$ is provided to sample/hold circuitry 25, which generates a differential signal-charge pair 36 and 38. The difference between signal charges 36 and 38 is proportional to the sampled value of $V_{in}$. Signal charge 36 is provided to signal channel 27 and signal charge 38 is provided to signal channel 28. Signal channel 27 contains three stages, labeled 40a, 40b and 40c, as does signal channel 28 which includes three stages labeled 42a, 42b, and 42c. Concomitantly, scaling channel 30 also includes three stages labeled 44a, 44b, and 44c, and scaling channel 32 also contains three stages, labeled 46a, 46b, and 46c. The charges in stage "a" of signal channels 27 and 28 are compared by the first voltage comparator 34a. The decision of the comparator 34a constitutes the digital output 48a from this stage, and indicates which of the two signal charges is larger. Two nominally-equal reference charges are stored in scaling channel stages 44a and 46a. As the signal charge pair is shifted out of stage "a" of signal channels 27 and 28, the comparator decision directs the addition of the reference charge from either scaling channel stage 44a or scaling channel stage 46a to the smaller member of the signal-charge pair. The unused reference charge is discarded. The charge pair resulting from these comparison and addition operations is provided to the next stages 40b and 42b of signal channels 27 and 28 respectively.

The operation is repeated, wherein the charges in the respective signal channel stages 40b and 42b are compared this time by comparator 34b. The decision of comparator 34b constitutes the digital output 48b from this stage, and indicates which of the two signal charges is larger. Two nominally equal reference charges are stored in scaling channel stages 44b and 46b. The reference charges in this stage, in the preferred embodiment, are approximately half the value of the reference charges of the previous stage. As the signal charge pair is shifted out of stage "b" of signal channels 27 and 28, the comparator decision directs the addition of the reference charge from either scaling channel stage 44b or scaling channel stage 46b to the smaller member of the signal-charge pair. The charge pair resulting from these comparison and addition operations is then fed to the next stages 40c and 42c of channels 27 and 28 respectively.

The operation is repeated again in the third stage, wherein the charges from the respective signal channel stages 40c and 42c are compared by comparator 34c. The decision of the comparator 34c constitutes the digital output 48c from this stage, and indicates which of the two signal charges is larger. Two nominally equal reference charges are stored in scaling channel stages 44c and 46c. The reference charges in this stage, in the preferred embodiment, are approximately half the value of the reference charges of the previous stage. The comparator decision directs the addition of the reference charge from either scaling channel stage 44c or scaling channel stage 46c to the smaller member of the pair. The charge pair resulting from these comparison and addition operations is output from the master ADC 22 at differential outputs 50 and 52.

Figure 4:
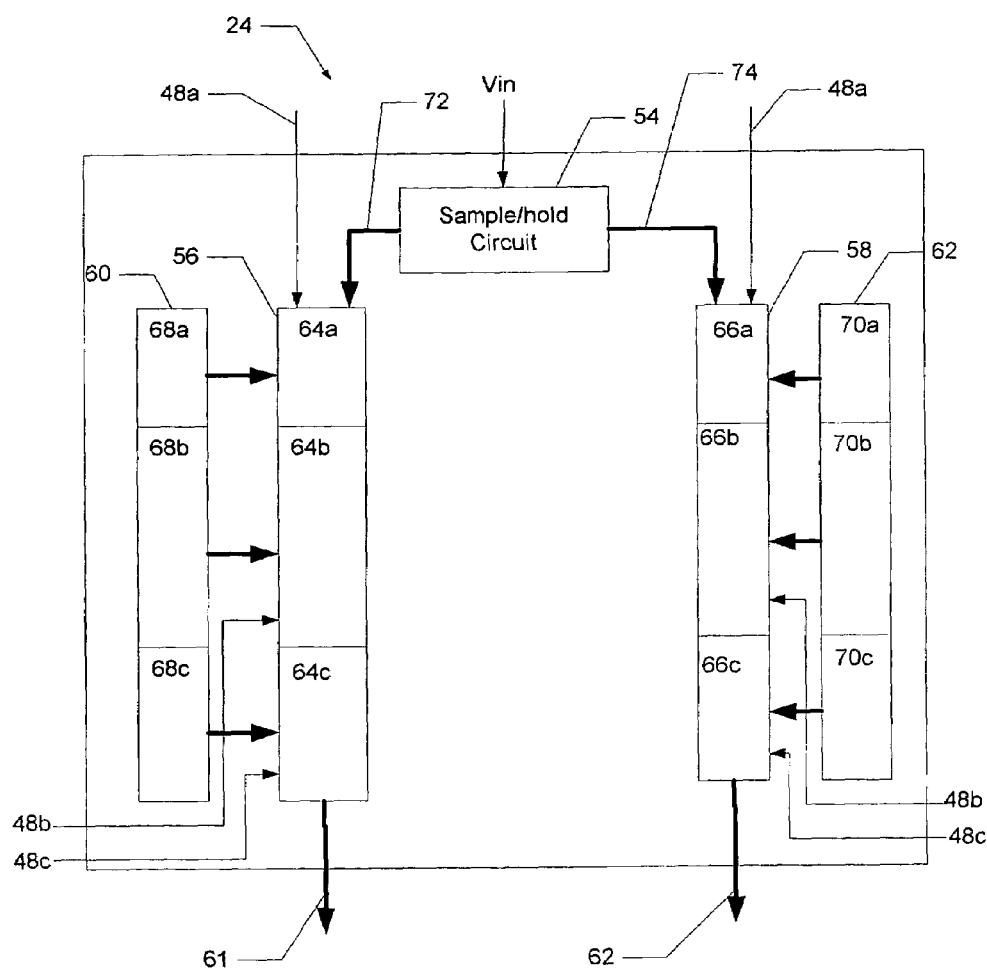
FIG. 4 is a block diagram of a slave ADC cell.

Referring now to FIG. 4, a slave ADC cell 24 is shown. This slave ADC cell 24 comprises a sample/hold circuit 54, two signal channels 56 and 58, and two scaling channels 60 and 62. Signal channel 56 contains three stages, labeled 64a, 64b and 64c, as does signal channel 58 which includes three stages labeled 66a, 66b, and 66c. Similarly, scaling channel 60 also includes three stages labeled 68a, 68b, and 68c, and scaling channel 62 also contains three stages, labeled 70a, 70b, and 70c. The slave ADC cell 24 described here includes three stages identified as "a", "b", and "c"; however, it should be appreciated that any number of stages could be used.

The slave ADC cell 24 operates as follows. An input signal $V_{in}$ is provided to sample/hold circuitry 54, which generates a sampled, proportional differential signal-charge pair 72 and 74. The input signal $V_{in}$ and the clock that determines the sampling instant are nominally identical for the master ADC and each slave cell 24. Signal charge 72 is provided to stage 64a of signal channel 56 and signal charge 74 is provided to stage 66a of signal channel 58.

The decision of comparator 34a of the Master ADC 22 constitutes the input 48a, and indicates which of the two signal charges is larger in stage "a" of the Master ADC, and correspondingly which of the signal charges in stages 64a and 66a is presumed to be larger. Two nominally equal reference charges are stored in scaling channel stages 68a and 70a. The input 48a directs the addition of the reference charge from either scaling channel stage 68a or scaling channel stage 70a to the smaller member of the signal-charge pair in signal channel stages 64a and 66a. The charge pair resulting from this addition operation is fed to the next stages 64b and 66b of signal channels 56 and 58 respectively.

The operation is repeated in the second stage, wherein the decision of comparator 34b of the Master ADC 10 constitutes the input 48b for this stage, and indicates which of the two signal charges is larger in stage "b" of the Master ADC. Two nominally equal reference charges are stored in scaling channel stages 68b and 70b. The reference charges in this stage, in the preferred embodiment, are approximately half the value of the reference charges of the previous stage. The input 48b directs the addition of the reference charge from either scaling channel stage 68b or scaling channel stage 70b to the presumably smaller member of the signal-charge pair in signal-channel stages 64b and 66b. The charge pair resulting from this addition operation is fed to the next stages 64c and 66c of channels 56 and 58 respectively.

The operation is repeated again in the third stage, wherein the decision of comparator 34c of the Master ADC 10 comprises the input 48c for this stage, and indicates which of the two signal charges is larger. Two nominally equal reference charges are stored in scaling channel stages 68c and 70c. The comparator decision directs the addition of the reference charge from either scaling channel stage 68c or scaling channel stage 70c to the presumably smaller member of the signal-charge pair. The charge pair resulting from this addition operation is output from slave cell 24 at differential outputs 61 and 62.

The previous paragraphs describe the operation of one slave cell. As described above, the steering of reference charge packets in all K slave cells 24 (as well as those in the master ADC 22) is controlled by signals from the comparators 34a–34c in the master ADC 22.

It can be seen from this description that the total charge being processed in the first block of the overall ADC is K times the charge in any one cell. The size of each cell (the W and L of its CCD registers) can be chosen to meet the ADC speed goal (within the unavoidable limits of the target fabrication process). The total charge needed to reach a desired ADC resolution can then be obtained simply by increasing K as needed.

Because the complete ADC employs a sub-ranging method, the comparator decisions in the first block need only be accurate enough for the number of bits developed in that block. This same relaxed accuracy requirement applies to the master ADC itself, since only its bit decisions (not other aspects of its operation) affect the signal charge passed on to the second block. The master ADC does not, in fact, need to be a charge-domain ADC, nor must it be pipelined. In some cases, it may be advantageous to make it a flash or other design, since its resolution and accuracy requirements are relaxed relative to the overall ADC.

The present invention provides several advantages over the prior art ADC architectures. The slave cells do not have to include floating gates, since all charge-steering decisions are made in the master ADC. As a result, the layout, charge-transfer efficiency, and charge-handling capacity of the device can be optimized. These optimizations reduce CCD clock power. Additionally, since no allowance needs to be made in the slave cells for physical comparator placement, the slave pipelines may be made with fewer stages than in a conventional charge-domain pipelined ADC. This reduction in number of stages further reduces CCD clock power.

A further advantage of using a multiplicity of slave cells is that overall ADC accuracy can be improved by interleaving the cells in an array. In this way, process gradients tend to cancel, both across cells and between complementary channels of the differential pair. In addition, if alternate cells in the array are mirrored in orientation, any effects due to mask misalignment will tend to cancel.

Yet another advantage provided by the present invention is that, because of the multiplicity of slave cells, inaccuracies in reference-charge introduction, in reference-charge scaling between pipeline stages, and in signal-charge introduction due to device-mismatch effects tend to average out, thus improving overall ADC accuracy.

As describe above, a new architecture is provided in which a master A/D converter of limited precision controls the adjustment-charge steering of a set of slave A/D converter pipelines or cells. This architecture relieves the layout constraints imposed by prior architectures and also reduces power consumption of the device. By spatially interleaving the slave pipelines in an array, the new architecture also improves accuracy.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. An apparatus comprising:
   a master analog-to-digital converter (ADC) having an input adapted to receive an analog signal to be converted, the master ADC further having a digital output of at least one bit: and
   a first analog-to-digital converter pipeline (ADCP) having an input adapted to receive said analog signal to be converted, said ADCP further having a digital input coupled to the digital output of said master ADC, said first ADCP further having an analog output wherein said first ADCP is a first one of a plurality of ADCPs, each one having a digital input coupled to the digital output of said master ADC, the apparatus further comprising a combiner having inputs adapted to receive the analog outputs from each of the plurality of ADCPs, said combiner further having an output.

2. The apparatus of claim 1 wherein said combiner output is a charge-domain signal comprising a pair of charges wherein a difference between said pair of charges represents the output signal.

3. The apparatus of claim 2 further comprising a common-mode reduction circuit having an input coupled to the output of said combiner, and having an output in which the common-mode charge is reduced relative to an output charge difference.

4. The apparatus of claim 3 wherein the output of said common-mode reduction circuit has substantially the same charge difference as said input of said common-mode reduction circuit, and wherein the output of said common-mode reduction circuit has a reduced common-mode charge.

5. The apparatus of claim 3 wherein the output of said common-mode reduction circuit has an amplified charge difference relative to said input of said common-mode reduction circuit, and wherein the output of said common-mode reduction circuit has a reduced relative common-mode charge.

6. The apparatus of claim 3 further comprising a second charge-domain ADC block, having an analog input coupled to the output of said common-mode reduction circuit and having a digital output of at least one bit.

7. An apparatus comprising:
   a master analog-to-digital converter (ADC) having an input adapted to receive an analog signal to be converted, the master ADC further having a digital output of at least one bit; and
   a first analog-to-digital converter pipeline (ADCP) having an input adapted to receive said analog signal to be converted said ADCP further having a digital input coupled to the digital output of said master ADC, said first ADCP further having an analog output wherein the ADCP comprises:
   a sample and hold circuit coupled to said input adapted to receive a signal to be converted, said sample and hold circuit having a first output and a second output;
   a first charge-coupled device (CCD) signal channel coupled to the first output of said sample and hold circuit;
   a second CCD signal channel coupled to the second output of said sample and hold circuit;
   a first CCD scaling channel coupled to said first CCD signal channel; and a second CCD scaling channel coupled to said second CCD signal channel, wherein addition of charge from the respective first and second scaling channels to the respective first and second signal channels is controlled by said digital input.

8. The apparatus of claim 7 wherein said first CCD scaling channel and said second CCD scaling channel include respective reference charges which are substantially equal.

9. The apparatus of claim 7 wherein said first CCD signal channel, said second CCD signal channel, said first CCD scaling channel and said second CCD scaling channel include a plurality of stages.

10. The apparatus of claim 9 wherein each stage of said first CCD scaling channel and said second CCD scaling channel have a respective reference charge and wherein a value of a reference charge in a respective stage is approximately half a value of a reference charge of a previous stage.

11. A method of converting a signal from analog to digital form comprising:
receiving a signal to be converted at an input of a master ADC;
receiving the signal to be converted at one or more ADCPs;
sampling the signal in the master ADC;
sampling the signal in each ADCP, resulting in an output comprising a charge pair having a difference proportional to the signal;
performing an analog-to-digital conversion in the master ADC, resulting in at least one output bit; and
selectively adding charge at each stage of each ADCP based upon the at least one output bit from the master ADC, resulting in ADCP outputs having a reduced charge difference as compared to a sampling result.

12. The method of claim 11 further comprising combining the outputs of said one or more ADCPs to produce a new output having a charge difference comprising the sum of the charge differences of each output of said ADCPs and having a common-mode charge comprising a sum of the common-mode charges of each output of said ADCP.

13. The method of claim 12 further comprising reducing the common-mode charge of the combined output relative to the charge difference.

14. The method of claim 13 wherein the common-mode charge of the combined output is reduced while the charge difference is substantially unchanged.

15. The method of claim 13 wherein the charge difference of the combined output is amplified while the relative common-mode charge is reduced.

16. The method of claim 12 further comprising receiving the common-mode-reduced charge output as input to a second charge-domain ADC.

* * * * *

UNITED STATES PATENT AND TRADEMARK OFFICE
CERTIFICATE OF CORRECTION

| | | |
|---|---|---|
| PATENT NO. | : 7,015,854 B2 | Page 1 of 1 |
| APPLICATION NO. | : 10/889281 | |
| DATED | : March 21, 2006 | |
| INVENTOR(S) | : Anthony | |

It is certified that error appears in the above-identified patent and that said Letters Patent is hereby corrected as shown below:

Column 7, line 52 delete "As describe above," and replace with --As described above,--.

Column 7, line 64 delete "it is submitted that that the" and replace with --it is submitted that the--.

Signed and Sealed this

Twenty Second Day of April, 2008

JON W. DUDAS
*Director of the United States Patent and Trademark Office*